United States Patent
Fukuda

(10) Patent No.: US 7,102,863 B2
(45) Date of Patent: Sep. 5, 2006

(54) ELECTROSTATIC BREAKDOWN PREVENTING CIRCUIT FOR SEMICONDUCTOR DEVICE

(75) Inventor: Yasuhiro Fukuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 412 days.

(21) Appl. No.: 10/355,190

(22) Filed: Jan. 31, 2003

(65) Prior Publication Data

US 2003/0235020 A1    Dec. 25, 2003

(30) Foreign Application Priority Data

Jun. 19, 2002    (JP)    ............................. 2002-178338

(51) Int. Cl.
    *H02H 3/22*    (2006.01)
(52) U.S. Cl. ........................................ 361/56; 361/111
(58) Field of Classification Search ................ 361/56, 361/57, 58, 91.1, 110, 111
    See application file for complete search history.

(56) References Cited

U.S. PATENT DOCUMENTS

| | | | | |
|---|---|---|---|---|
| 5,589,790 | A * | 12/1996 | Allen ........................ | 327/333 |
| 5,744,842 | A * | 4/1998 | Ker ........................... | 257/362 |
| 5,870,268 | A * | 2/1999 | Lin et al. ................... | 361/111 |
| 5,946,177 | A * | 8/1999 | Miller et al. ................ | 361/56 |
| 6,144,542 | A * | 11/2000 | Ker et al. ................... | 361/111 |
| 6,424,510 | B1 * | 7/2002 | Ajit et al. ................... | 361/59 |
| 6,617,906 | B1 * | 9/2003 | Hastings .................... | 327/321 |
| 6,650,165 | B1 * | 11/2003 | Mallikarjunaswamy ..... | 327/310 |

FOREIGN PATENT DOCUMENTS

JP    7503599    4/1995

* cited by examiner

*Primary Examiner*—Brian Sircus
*Assistant Examiner*—Danny Nguyen
(74) *Attorney, Agent, or Firm*—Rabin & Berdo, P.C.

(57) ABSTRACT

An electrostatic breakdown preventing circuit has first and second conductive lines, a diode, a power clamp circuit and first and second capacitors. The first and second conductive lines are connected to a first potential source and a second potential source, respectively. The internal circuit is connected between the first and second conductive lines. The internal circuit operates in response to an input signal. The diode is connected in a forward direction between an input terminal and the second conductive line. The first capacitor is connected between the node and the first conductive line. The second capacitor is connected between the node and the second power conductive line. The capacitances of the first and second capacitors are set in such a manner that the transistor is brought to an OFF state upon a normal operation and brought to an ON state upon the input of an electrostatic surge.

22 Claims, 3 Drawing Sheets

ELECTROSTATIC BREAKDOWN PREVENTING CIRCUIT FOR SEMICONDUCTOR DEVICE

BACKGROUND OF THE INVENTION

The present invention relates to an input circuit for a semiconductor device, and particularly to an electrostatic breakdown preventing and protecting circuit suitable for use in a semiconductor device.

DESCRIPTION OF THE RELATED ART

Progress is now making in micro-fabricating a device together with an improvement in the degree of integration in a semiconductor integrated circuit. Thus, the semiconductor integrated circuit involves a large problem in preventing a breakdown phenomenon and an electrostatic breakdown phenomenon produced due to the inflow of a surge due to the external discharge of static electricity. Therefore, an electrostatic protection circuit has been proposed to protect various input terminals.

A conventional protection circuit having a protective element provided only for an input terminal has been placed under such a situation that these electrostatic breakdown phenomena cannot be prevented. As the conventional protection circuit, may be mentioned, a simple diode-type electrostatic breakdown protecting circuit. In the case of the provision of such an electrostatic breakdown protecting circuit alone, a phenomenon has been recently brought to the fore, wherein when a negative-polarity electrostatic surge flows into an input terminal in association with a Vcc (power) terminal, an internal circuit is broken when an electrostatic surge current flows in a diode connected between the input terminal and the power terminal backwardly (it is destructed very easily with respect to the passage of an electrostatic surge current due to a backward surge response in the case of a diode), or an electrostatic surge current flows in a diode connected between a Vss (GND) conductive line and an input terminal in a forward direction and further flows into a Vcc (power) conductive line via an internal circuit, whereby the internal circuit is broken.

Therefore, a circuit provided with a protection transistor (hereinafter called a "power clamp transistor") whose gate is connected to a Vss conductive line, or a diode installed therein has recently been adopted between a Vcc (power) conductive line and a Vss (GND) conductive line. Incidentally, as references illustrative of the above-described circuit, may be mentioned the following ones.

1. Michael Chaine (1), Scott Smith, Anh Bui, "Unique ESD Failure Mechanisms During Negative To Vcc HBM"; (EOS/ESD Symposium 97-346)
2. Yasuhiro Fukuda, Katsuhiro Kato, "VLSI ESD Phenomenon and Protection"; (EOS/ESD Symposium 88–230)
3. Katsuhiro Kato, Yasuhiro Fukuda, "ESD Evaluation by TLP Method on Advanced Semiconductor Devices"; (EOS/ESD Symposium 2001)

In the electrostatic breakdown protecting circuit provided with the power clamp transistor, however, the power clamp transistor eventually makes a backward response to the electrostatic surge current when the negative-polarity electrostatic surge flows into the input terminal with respect to the Vcc (power) terminal. Therefore, a response time of a path becomes slower than the backward response of the diode connected between the input terminal and the power terminal to the electrostatic surge according to the lengths and shapes of the Vcc (power) conductive line and Vss (GND) conductive line and the installed position of the power clamp transistor, etc. Thus, the electrostatic surge current flows in the backward direction of the diode connected between the input terminal and the power terminal, so that the internal circuit cannot be prevented from breaking down.

SUMMARY OF THE INVENTION

The present invention aims to solve the foregoing problem and to provide an electrostatic breakdown preventing circuit suitable for a semiconductor device, which is capable of preventing breakdown of a diode connected between an input terminal and a power terminal.

An electrostatic breakdown preventing circuit according to the present invention has a power clamp transistor provided between a first power conductive line and a second power conductive line. Further, capacitors are connected in series between the first power conductive line and the second power conductive line. A potential capacity-divided by the capacitances of these capacitors is supplied to the gate of the power clamp transistor.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
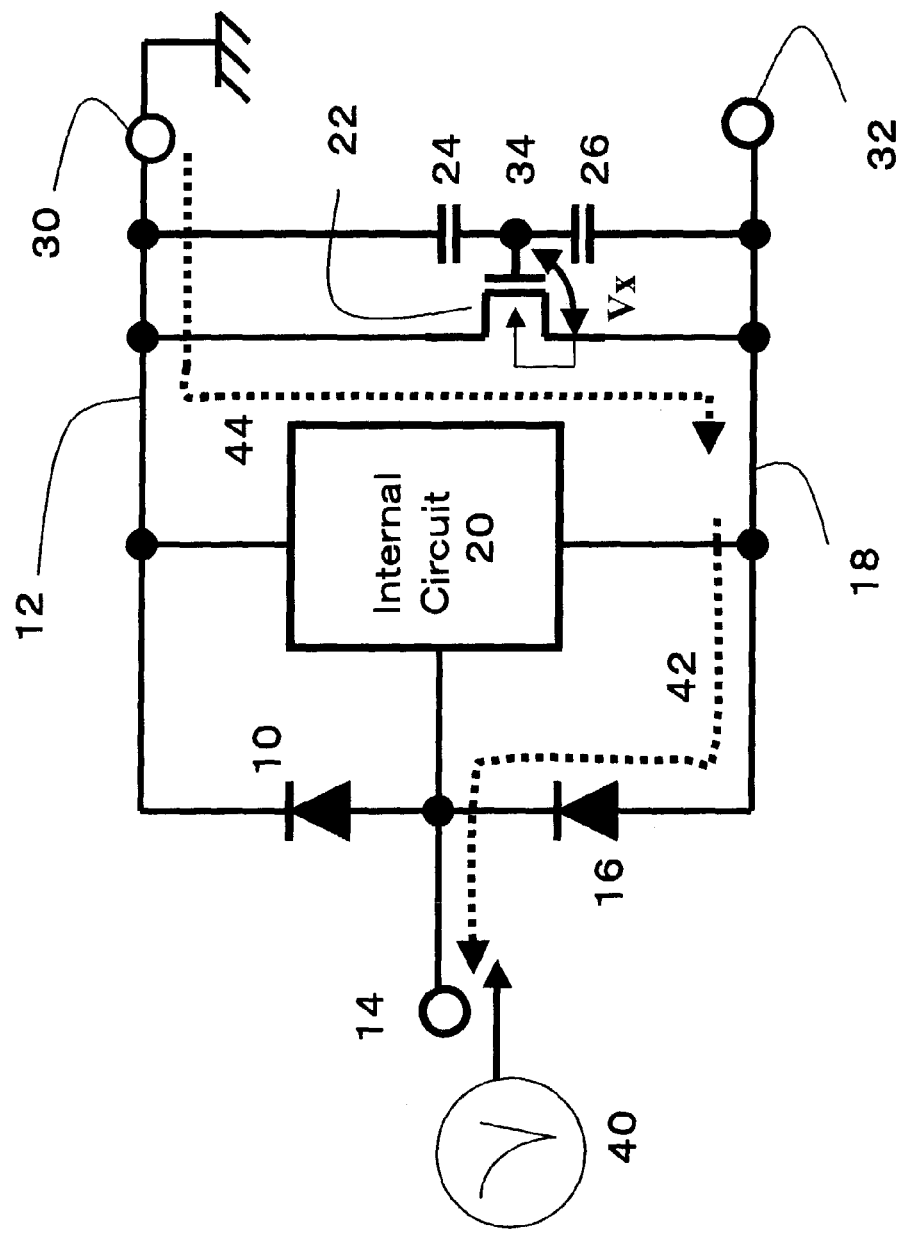
FIG. 1 is a circuit diagram of an electrostatic breakdown preventing circuit according to a first embodiment of the present invention.

An electrostatic breakdown preventing circuit according to a first embodiment of the present invention is shown in FIG. 1. The first embodiment of the present invention will be described while referring to FIG. 1.

The electrostatic breakdown preventing circuit shown in FIG. 1 is a diode-type electrostatic breakdown input protecting circuit. A first diode 10 is connected in a backward direction between a Vcc (power) conductive line 12 and an input terminal 14. The power conductive line 12 is connected to a high potential source via a Vcc (power) terminal 30 (since FIG. 1 shows an example in which an internal circuit is operated at a negative potential, the power terminal 30 is grounded). A second diode 16 is backwardly connected between a Vss (GND) conductive line 18 and the input terminal 14. The GND conductive line 18 is connected to an unillustrated low potential source via a Vss (GND) terminal 32. Incidentally, the internal circuit 20 intended for protection is connected between the Vcc (power) conductive line 12 and the Vss (GND) conductive line 18 and receives an input signal from the input terminal 14.

An power clamp transistor 22 is connected between the power conductive line 12 and the GND conductive line 18. The power clamp transistor 22 employed in the first embodiment is of an NMOS transistor. The gate of the power clamp transistor 22 is connected to a node 34. The node 34 is connected to the power conductive line 12 via a first capacitor 24. Further, the node 34 is connected even to the GND conductive line 18 via a second capacitor 26. Thus, assuming that the difference in potential between the power conductive line 12 and the GND conductive line 18 is defined as Vdiff, the capacitance of the first capacitor 24 is defined as C1, and the capacitance of the second capacitor 26 is defined as C2, a potential Vnode at the node 34 is expressed in the following equation (1):

$$V\text{node}=V\text{diff}\times C1/(C1+C2) \quad (1)$$

When the power clamp transistor 22 is turned ON in a normal state, a current flows between the power conductive line 12 and the GND conductive line 18. Therefore, the power clamp transistor 22 must be kept OFF. Thus, the capacitances C1 and C2 of the first and second capacitors 24 and 26 must meet or satisfy a condition for the following equation (2) when the threshold value of the power clamp transistor 22 is assumed to be Vnth:

$$V\text{nth}>>V\text{diff}\times C1/(C1+C2) \quad (2)$$

Assuming that Vdiff is 5V and Vnth is 3V, it is necessary to set the value of Vnode to 0.25V equivalent to about $\frac{1}{10}$ or less of Vnth. Thus, if C1:C2=1:19, then Vnode=0.25V.

The operation of the electrostatic breakdown preventing circuit at the inflow of a negative-polarity electrostatic surge 40 will next be described while the flow of the negative-polarity electrostatic surge 40 into the input terminal 14 with respect to the power terminal 30 is being taken as an example.

Since a backward electrostatic surge current flows in the first diode 10 when the negative-polarity electrostatic surge 40 flows into the input terminal 14, a response time is taken. Accordingly, the electrostatic surge current responds in the forward direction of the second diode 16 and flows out into the input terminal 14 via a path 42. A potential V1 of the negative-polarity electrostatic surge 40 is considered to be on the order of a few −100V. Thus, the potential at the GND conductive line 18, i.e., the potential at the source of the power clamp transistor 22 results in V1.

When the negative-polarity electrostatic surge current 40 flows herein, the difference in potential between the power conductive line 12 and the GND conductive line 18 becomes approximately equal to the potential V1 of the negative-polarity electrostatic surge 40. Let's assume that the capacitances of the first capacitor 24 and the second capacitor 26 are defined as C1:C2=1:19 with V1=−200V. A potential difference Vx between the source and gate of the power clamp transistor 22 is expressed in the following equation (3):

$$Vx=V\text{diff}\times C2/(C1+C2) \quad (3)$$

Therefore, when Vx is calculated with Vdiff≈V1, Vx=190V. Accordingly, when the negative-polarity electrostatic surge current 40 flows, the power clamp transistor 22 is brought to an ON state.

When the power clamp transistor 22 is brought to the ON state, the electrostatic surge current can flow out in order of the power terminal 30→GND conductive line 18→second diode 16 (forward direction)→input terminal 14, i.e., it can go through a path 44 and the path 42. Since both the power clamp transistor 22 and the second diode 16 respond in the forward direction, the response to the electrostatic surge 40 is fast and no backward response occurs. Thus, the power clamp transistor 22 and the second diode 16 become hard to break down and hence properties resistant to its breakdown are improved. Since the response to the electrostatic surge current due to the backward breakdown of the first diode 10 does not occur, the yielding of a reduction in the breakdown resistance can be also prevented.

Incidentally, the capacitance of the first capacitor 24 is extremely smaller than the capacitance of the second capacitor 26 in the present embodiment. Accordingly, the second capacitor 26 is actually provided between the gate of the power clamp transistor 22 and the GND conductive line 18, and a parasitic capacity formed between a conductive line for electrically connecting the gate of the power clamp transistor 22 and the second capacitance 26 and the power conductive line 12 may be used as the first capacitor 24. It is difficult to control the capacitance of the parasitic capacity in such a case. However, the capacitance of the second capacitor 26 is set so as to become larger than a designed value, so that variations developed in the capacitance of the parasitic capacity can be neglected.

Figure 2:
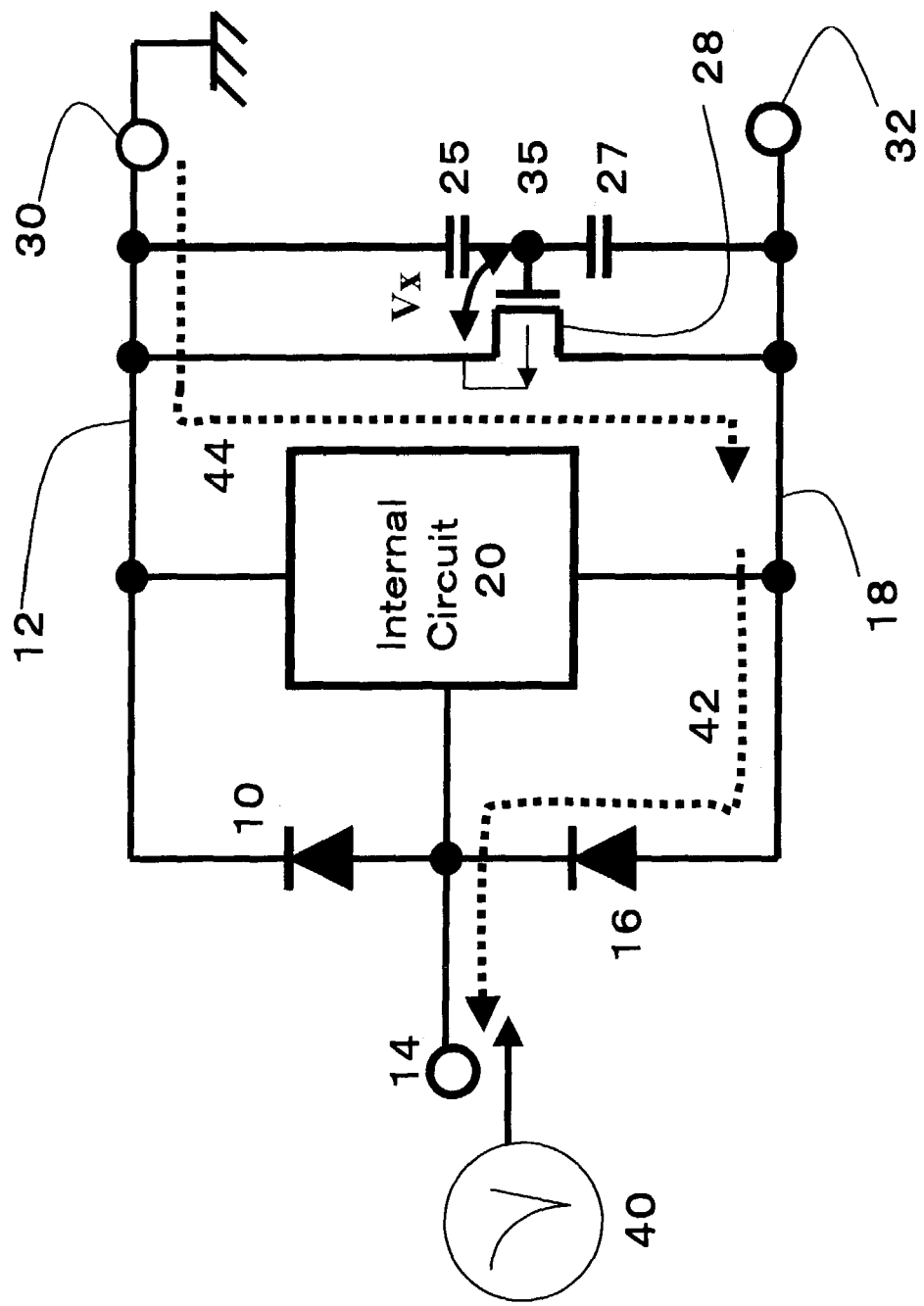
FIG. 2 is a circuit diagram of an electrostatic breakdown preventing circuit according to a second embodiment of the present invention.

Next, an electrostatic breakdown preventing circuit according to a second embodiment of the present invention is shown in FIG. 2. In the second embodiment, components identical to those employed in the first embodiment are respectively identified by the same reference numerals and their description will be omitted.

In the electrostatic breakdown preventing circuit shown in FIG. 2 according to the second embodiment, a PMOS power clamp transistor 28 is used as an alternative to the NMOS power clamp transistor 22 employed in the first embodiment. The gate of the power clamp transistor 28 is connected to a node 35. The node 35 is connected to a power conductive line 12 via a third capacitor 25. Further, the node 35 is connected even to a GND conductive line 18 via a fourth capacitor 27. Thus, assuming that the difference in potential between the power conductive line 12 and the GND conductive line 18 is defined as Vdiff, the capacitance of the third capacitor 25 is defined as C3, and the capacitance of the fourth capacitor 27 is defined as C4, a potential Vnode at the node 35 is expressed in the following equation (4):

$$V\text{node}=V\text{diff}\times C3/(C3+C4) \quad (4)$$

When the power clamp transistor 28 is turned ON in a normal state, a current flows between the power conductive line 12 and the GND conductive line 18. Therefore, the power clamp transistor 28 must be kept OFF. Thus, the capacitances C3 and C4 of the third and fourth capacitors 25 and 27 must satisfy a condition for the following equation (5) when the threshold value of the power clamp transistor 28 is assumed to be Vpth.

$$V\text{pth}>>V\text{diff}\times C4/(C3+C4) \quad (5)$$

Assuming that Vdiff is 5V and Vpth is 3V, it is necessary to set the value of Vnode to 0.25V equivalent to about $\frac{1}{10}$ or less of Vpth. Thus, if C3:C4=19:1, then Vnode=4.75V.

The operation of the electrostatic breakdown preventing circuit at the inflow of a negative-polarity electrostatic surge will next be described while the flow of the negative-polarity electrostatic surge 40 into an input terminal 14 with respect to a power terminal 30 is being taken as an example.

When the negative-polarity electrostatic surge current 40 flows, the difference in potential between the power conductive line 12 and the GND conductive line 18 becomes approximately equal to the potential V1 of the negative-polarity electrostatic surge 40. Let's assume that the capacitances of the third capacitor 25 and the fourth capacitor 27 are defined as C3:C4=19:1 with V1=−200V in a manner similar to the first embodiment. A potential difference Vx between the source and gate of the power clamp transistor 28 is expressed in the following equation (6):

$$Vx = Vdiff \times C3/(C3+C4) \qquad (6)$$

Therefore, when Vx is calculated with Vdiff≈V1, Vx=190V. Accordingly, when the negative-polarity electrostatic surge current 40 flows, the power clamp transistor 28 is brought to an ON state.

When the power clamp transistor 28 is brought to the ON state, the electrostatic surge current can flow out in order of the power terminal 30→GND conductive line 18→second diode 16 (forward direction)→input terminal 14, i.e., it can go through a path 44 and a path 42.

Incidentally, the capacitance of the fourth capacitor 27 is extremely smaller than the capacitance of the third capacitor 25 in the second embodiment. Accordingly, the third capacitor 25 is actually provided between the gate of the power clamp transistor 28 and the power conductive line 18, and a parasitic capacity formed between a conductive line for electrically connecting the gate of the power clamp transistor 28 and the third capacitor 25 and the GND conductive line 18 may be used as the fourth capacitor 27. It is difficult to control the capacitance of the parasitic capacity in such a case. However, the capacitance of the third capacitor 25 is set so as to become larger than a designed value, whereby variations developed in the capacitance of the parasitic capacity can be neglected.

Figure 3:
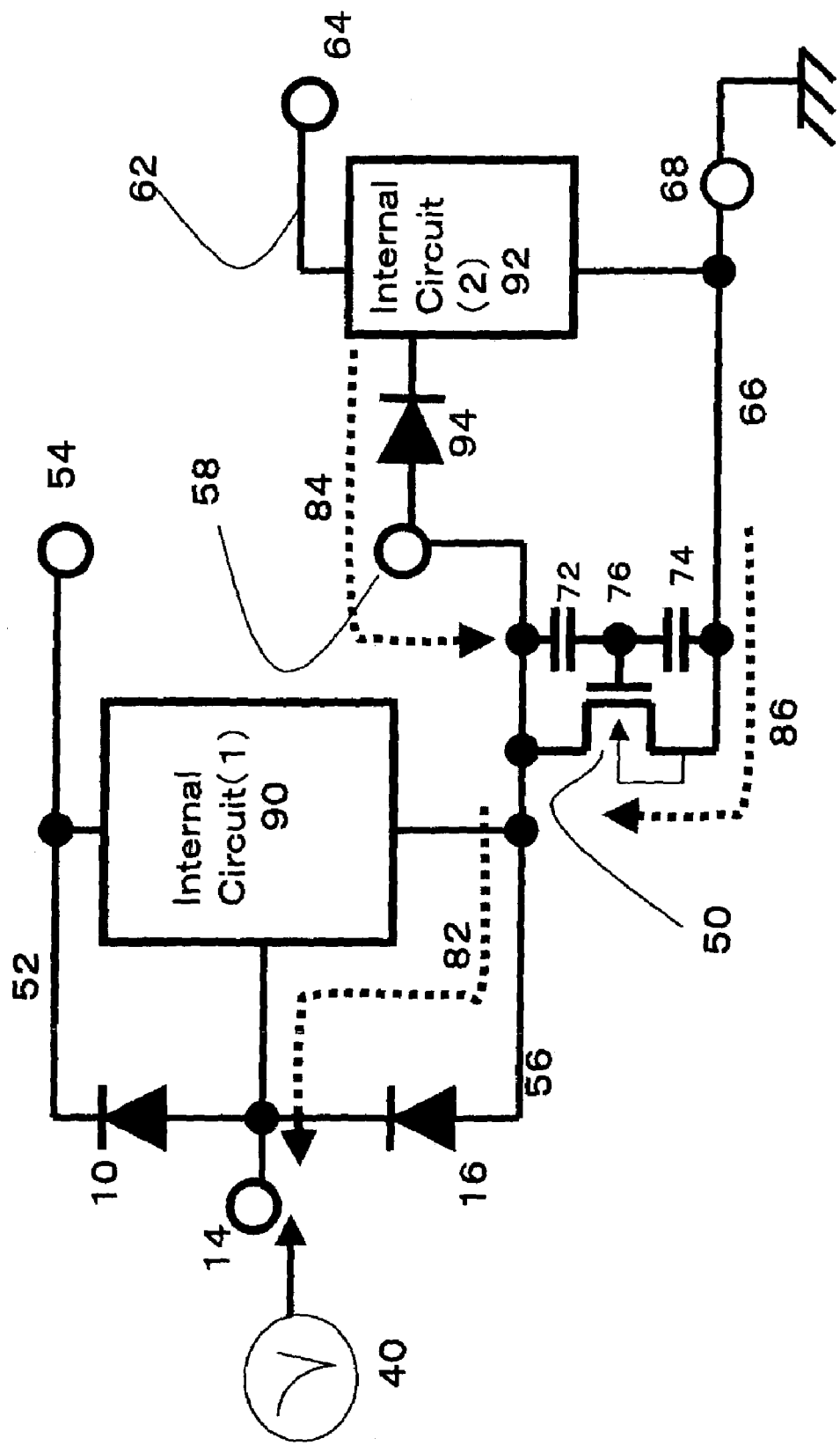
FIG. 3 is a circuit diagram of an electrostatic breakdown preventing circuit according to a third embodiment of the present invention.

An electrostatic breakdown preventing circuit according to a third embodiment of the present invention is shown in FIG. 3. Third embodiment of the present invention is intended for an electrostatic breakdown preventing circuit in a circuit driven by a multi-power supply within the same chip.

The electrostatic breakdown preventing circuit according to the third embodiment is a diode-type electrostatic breakdown input protecting circuit in a manner similar to the first and second embodiments. A first diode 10 is connected in a backward direction between a Vcc1 (first power) conductive line 52 and an input terminal 14. The first power conductive line 52 is connected to an unillustrated first high potential source via a Vcc1 (first power) terminal 54. A second diode 16 is backwardly connected between a Vss1 (first GND) conductive line 56 and the input terminal 14. The first GND conductive line 56 is connected to an unillustrated first low potential source via a Vss1 (first GND) terminal 52. Incidentally, a first internal circuit 90 intended for protection is connected between the first power conductive line 52 and the first GND conductive line 56. The first internal circuit 90 receives an input signal from the input terminal 14 and is driven by the first high potential source (or first low potential source).

A second internal circuit 92, which is driven by a power supply different from one for the first internal circuit 90, is further formed with the same chip in the third embodiment. The second internal circuit 92 is connected between a Vcc2 (second power) conductive line 62 and a Vss2 (first GND) conductive line 66. The second power conductive line 62 is connected to an unillustrated second high potential source via a Vcc2 (second power) terminal 64. The second GND conductive line 66 is connected to an unillustrated second low potential source via a Vss2 (second GND) terminal 68.

Although a signal to be inputted to the second internal circuit 92 is not illustrated, it is inputted from another circuit lying within the same chip, such as the first internal circuit 90.

A parasitic diode is formed between a device lying in the first internal circuit 90 and a device lying in the second internal circuit 92. The parasitic diode 94 is represented in the form of being connected to the second internal circuit 92 in the forward direction as viewed from a first GND terminal 58.

In the electrostatic breakdown preventing circuit according to the third embodiment, a power clamp transistor 50 is connected between the first GND conductive line 56 and the second GND conductive line 66. The power clamp transistor 50 employed in the third embodiment is an NMOS transistor. The gate of the power clamp transistor 50 is connected to a node 76. The node 76 is connected to the first GND conductive line 56 via a fifth capacitor 76. Further, the node 76 is connected even to the second GND conductive line 66 via a sixth capacitor 74. Assuming that the difference in potential between the first GND conductive line 56 and the second GND conductive line 66 is defined as Vgdiff, the capacitance of the fifth capacitor 72 is defined as C5, and the capacitance of the sixth capacitor 74 is defined as C6, a potential Vnode76 at the node 76 is expressed in the following equation (7):

$$Vnode76 = Vgdiff \times C5/(C5+C6) \qquad (7)$$

When the power clamp transistor 50 is turned ON in a normal state, a current flows between the first GND conductive line 56 and the second GND conductive line 66. Therefore, the power clamp transistor 50 must be kept OFF. Thus, the capacitances C5 and C6 of the fifth and sixth capacitors 72 and 74 in the normal state must satisfy a condition for the following equation (8) when the threshold value of the power clamp transistor 50 is assumed to be Vn50th.

$$Vn50th >> Vgdiff \times C5/(C5+C6) \qquad (8)$$

Assuming that Vgdiff is 3V and Vn50th is 2V, it is necessary to set the value of Vnode76 to 0.3V equivalent to about 1/10 or less of Vn50th. Thus, if C5:C6=1:9, then Vnode76=0.3V.

The operation of the electrostatic breakdown preventing circuit at the inflow of a negative-polarity electrostatic surge will next be described while the flow of the negative-polarity electrostatic surge 40 into the input terminal 14 with respect to the second GND terminal 68 is being taken as an example.

Since a backward electrostatic surge current flows in the first diode 10 when the negative-polarity electrostatic surge 40 flows into the input terminal 14, a response time is taken. Accordingly, the electrostatic surge current first responds in the forward direction of the second diode 16 and then flows into the input terminal 14 via a path 82. A potential V1 of the negative-polarity electrostatic surge 40 is considered to be on the order of a few −100V. Thus, the first GND conductive line 56 is reduced to the negative potential V1.

If the power clamp transistor 50 is not provided herein, then an electrostatic surge current flows from the second GND terminal 68 to the first GND conductive line 56 through a backward response of the parasitic diode 94 connected to the first GND terminal 58. There is a possibility that the parasitic diode 94 and the second internal circuit 92 will be broken down due to the electrostatic surge current.

According to the third embodiment, however, since the power clamp transistor 50 and the fifth and sixth capacitors 72 and 74 exist, the power clamp transistor 50 is brought to an ON state so that the negative-polarity electrostatic surge current flows out via the paths 82 and 86 (i.e., second GND terminal 68→second GND conductive line 66→power clamp transistor 50 being in the ON state→first GND conductive line 56→input terminal 14). Since a backward response phenomenon with a breakdown phenomenon does not exist in this path, a device breakdown is hard to occur.

Incidentally, the reason why the power clamp transistor 50 is brought to the ON state, can be explained in the following manner.

When the negative-polarity electrostatic surge current 40 flows, the difference in potential between the first GND conductive line 56 and the second GND conductive line 66 becomes approximately equal to the potential V1 of the negative-polarity electrostatic surge 40. Let's assume that the capacitances of the fifth capacitor 72 and the sixth capacitor 74 are defined as C5:C6=1:9 with V1=−200V. A potential difference Vx between the source and gate of the power clamp transistor 50 is expressed in the following equation (9):

$$Vx = Vgdiff \times C6/(C5+C6) \quad (9)$$

Therefore, when Vx is calculated with Vgdiff≈V1, Vx=180V. Accordingly, when the negative-polarity electrostatic surge current 40 flows, the power clamp transistor 50 is brought to an ON state.

Incidentally, the capacitance of the fifth capacitor 72 is extremely smaller than the capacitance of the sixth capacitor 74 in the third embodiment. Accordingly, the sixth capacitor 74 is actually provided between the gate of the power clamp transistor 50 and the second GND conductive line 66, and a parasitic capacity formed between a conductive line for electrically connecting the gate of the power clamp transistor 50 and the sixth capacitor 74 and the first GND conductive line 56 may be used as the fifth capacitor 72. It is difficult to control the capacitance of the parasitic capacity in such a case. However, the capacitance of the sixth capacitor 74 is set so as to become larger than a designed value, so that variations developed in the capacitance of the parasitic capacity can be neglected.

While the power clamp transistor 50 is provided between the first and second GND conductive lines 56 and 66 in the third embodiment, the power clamp transistor may be provided either between the first and second power conductive lines 52 and 62 or between the first and second GND conductive lines 56 and 66 so that electrostatic resistance can be improved. At this time, the capacitance of the parasitic capacity provided between the power conductive lines may be set such that the power clamp transistor 50 is not brought to the ON state, and the capacitance thereof may be set in such a manner that the power clamp transistor 50 is brought to the ON state upon the inflow of the negative-polarity electrostatic surge.

While the third embodiment shows the example in which the power clamp transistor 50 is of the NMOS transistor, it may be configured as the PMOS transistor as in the second embodiment. The setting of the capacitance of a capacitor where the power clamp transistor is of the PMOS transistor, is easily considered from the second embodiment.

While the N type or P type MOS transistor has been described as the transistor by way of example in the first through third embodiments, the transistor is of course applicable even to an N type or P type MIS transistor.

According to the electrostatic breakdown preventing circuit of the present invention as described above in detail, since a path for causing an electrostatic surge current to flow can be ensured without using a device that produces a reduction in backward response, an electrostatic breakdown preventing circuit hard to cause a device breakdown can be provided.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An electrostatic breakdown preventing circuit, comprising:
    an input terminal for receiving an input signal;
    a first power conductive line connected to a first potential source;
    a second power conductive line connected to a second potential source;
    an internal circuit connected between the first and second power conductive lines, the internal circuit operating in response to the input signal;
    a diode connected between the input terminal and the second power conductive line;
    a power clamp transistor connected between the first and second power conductive lines, the power clamp transistor having a gate connected to a node, the power clamp transistor electrically connecting the first and second power conductive lines during an ON state;
    a first capacitor connected between the node and the first power conductive line; and
    a second capacitor connected between the node and the second power conductive line,
    wherein the capacitances of the first and second capacitors are set in such a manner that the transistor is brought to an OFF state upon a normal operation and brought to the ON state upon the input of an electrostatic surge.

2. An electrostatic breakdown preventing circuit according to claim 1, wherein the capacitances of the first and second capacitors are set such that a potential at the node reaches approximately ⅒ of a threshold voltage of the transistor.

3. An electrostatic breakdown preventing circuit according to claim 1, further including a second diode connected between the input terminal and the first power conductive line.

4. An electrostatic breakdown preventing circuit according to claim 1, wherein the power clamp transistor is an N type MISFET.

5. An electrostatic breakdown preventing circuit according to claim 4, wherein the first capacitor is a capacitance parasitically formed between the first power conductive line and a conductive line for electrically connecting the gate of the power clamp transistor and the second capacitor.

6. An electrostatic breakdown preventing circuit according to claim 1, wherein said the protection transistor is a P type MISFET.

7. An electrostatic breakdown preventing circuit according to claim 6, wherein the second capacitor is a capacitance parasitically formed between the second power conductive line and a conductive line for electrically connecting the gate of the power clamp transistor and the first capacitor.

8. An electrostatic breakdown preventing circuit, comprising:
    an input terminal for receiving an input signal;
    a first power conductive line connected to a first potential source;
    a second power conductive line connected to a second potential source;

a first internal circuit connected between the first and second power conductive lines, the first internal circuit operating in response to the input signal;

a third power conductive line connected to a third potential source;

a fourth power conductive line connected to a fourth potential source;

a second internal circuit connected between the third and fourth power conductive lines, the second internal circuit being driven by the third or fourth potential source;

a diode connected between the input terminal and the second power conductive line;

a protection transistor connected between any two of the first through fourth power conductive lines and having a gate connected to a node, the protection transistor electrically connecting the two of the first through fourth power conductive lines during an ON state;

a first capacitor connected between the node and one power conductive line connected to the protection transistor; and a second capacitor connected between the node and the other power conductive line connected to the protection transistor, wherein the capacitances of said first and second capacitors are set in such a manner that the transistor is brought to an OFF state upon a normal operation and brought to the ON state upon the input of an electrostatic surge.

9. An electrostatic breakdown preventing circuit according to claim 8, wherein the capacitances of the first and second capacitors are set such that a potential at the node becomes approximately $1/10$ of a threshold value of said transistor upon the normal operation.

10. An electrostatic breakdown preventing circuit according to claim 8, further including a second diode connected between said input terminal and said first power conductive line.

11. An electrostatic breakdown preventing circuit according to claim 8, wherein the transistor is an N type MISFET.

12. An electrostatic breakdown preventing circuit according to claim 8, wherein said transistor is a P type MISFET.

13. An electrostatic breakdown preventing circuit according to claim 8, wherein either the first or second capacitor having a small capacitance is a capacitance parasitically formed between the corresponding power conductive line connected to the protection transistor and a conductive line for electrically connecting the gate of the protection transistor and either the first or second capacitor having a large capacitance.

14. An electrostatic breakdown preventing circuit, comprising:

an input terminal receiving an input signal;

a first conductive line applied to a first potential level;

a second conductive line applied to a second potential level, wherein the first and second levels have a voltage difference Vdiff;

an internal circuit connected between the first and second conductive lines, the internal circuit receiving the input signal;

a diode having an anode connected to the input terminal and a cathode connected to the second conductive line;

a power clamp transistor connected between the first and second conductive lines, the power clamp transistor having a gate connected to a node, the power clamp transistor having a threshold voltage Vth, the power clamp transistor electrically connecting the first and second power conductive lines during an ON state;

a first capacitor connected between the node and the first conductive line, the first capacitor having a first capacitance C1; and a second capacitor connected between the node and the second conductive line, the second capacitor having a second capacitance C2, wherein the first and second capacitances are set in such a manner that the transistor is brought to an OFF state upon a normal operation and brought to the ON state upon the input of an electrostatic surge.

15. An electrostatic breakdown preventing circuit according to claim 14, wherein the first and second capacitances are set such that a potential at the node reaches approximately $1/10$ of the threshold voltage.

16. An electrostatic breakdown preventing circuit according to claim 14, further including an additional diode having an anode connected to the input terminal and a cathode connected to the first conductive line.

17. An electrostatic breakdown preventing circuit according to claim 14, wherein the power clamp transistor is an N type MISFET.

18. An electrostatic breakdown preventing circuit according to claim 17, wherein the voltage difference Vdiff, the first and second capacitances C1 and C2 and the threshold voltage Vth is set forth as the following inequality:

$$V\text{th} >> V\text{diff} \times C1/(C1+C2).$$

19. An electrostatic breakdown preventing circuit according to claim 17, wherein the first capacitor is a capacitance parasitically formed between the first conductive line and a conductive line for electrically connecting the gate of the power clamp transistor and the second capacitor.

20. An electrostatic breakdown preventing circuit according to claim 14, wherein said the protection transistor is a P type MISFET.

21. An electrostatic breakdown preventing circuit according to claim 20, wherein the voltage difference Vdiff, the first and second capacitances C1 and C2 and the threshold voltage Vth is set forth as the following inequality:

$$V\text{th} >> V\text{diff} \times C2/(C1+C2).$$

22. An electrostatic breakdown preventing circuit according to claim 20, wherein the second capacitor is a capacitance parasitically formed between the second power conductive line and a conductive line for electrically connecting the gate of the power clamp transistor and the first capacitor.

* * * * *